United States Patent
Teshiba et al.

(10) Patent No.: US 11,898,071 B2
(45) Date of Patent: Feb. 13, 2024

(54) PRESSURE-SENSITIVE ADHESIVE SHEET FOR SEMICONDUCTOR WAFER PROCESSING

(71) Applicant: NITTO DENKO CORPORATION, Ibaraki (JP)

(72) Inventors: Mariko Teshiba, Ibaraki (JP); Hiroki Kono, Ibaraki (JP)

(73) Assignee: NITTO DENKO CORPORATION, Ibaraki (JP)

(*) Notice: Subject to any disclaimer, the term of this patent is extended or adjusted under 35 U.S.C. 154(b) by 0 days.

(21) Appl. No.: 17/845,746

(22) Filed: Jun. 21, 2022

(65) Prior Publication Data

US 2022/0403214 A1 Dec. 22, 2022

(30) Foreign Application Priority Data

Jun. 21, 2021 (JP) .................. 2021-102607

(51) Int. Cl.
*C09J 7/38* (2018.01)
*H01L 21/683* (2006.01)
*C09J 7/29* (2018.01)

(52) U.S. Cl.
CPC ............ *C09J 7/385* (2018.01); *C09J 7/29* (2018.01); *H01L 21/6836* (2013.01)

(58) Field of Classification Search
CPC ............ C09J 7/385; C09J 2203/326; C09J 133/06–133/12
See application file for complete search history.

(56) References Cited

U.S. PATENT DOCUMENTS

| 4,756,968 A | 7/1988 | Ebe et al. |
| 4,965,127 A | 10/1990 | Ebe et al. |

(Continued)

FOREIGN PATENT DOCUMENTS

| JP | S62153376 A | 7/1987 |
| JP | H06049420 A | 2/1994 |

(Continued)

OTHER PUBLICATIONS

Machine translation of JP2020-025016. Retrieved Jun. 3, 2023.*

*Primary Examiner* — Prashant J Khatri
(74) *Attorney, Agent, or Firm* — Alleman Hall Creasman & Tuttle LLP (57) ABSTRACT

Provided is a pressure-sensitive adhesive sheet for semiconductor wafer processing that is excellent in adhesiveness with a semiconductor wafer, and that has light peelability and suppresses adhesive residue. The pressure-sensitive adhesive sheet for semiconductor wafer processing includes in this order: a base material; an intermediate layer; and a UV-curable pressure-sensitive adhesive layer. The intermediate layer has a storage modulus of elasticity at room temperature, $G'1_{RT}$, of from 300 kPa to 2,000 kPa, and a storage modulus of elasticity at 80° C., $G'1_{80}$, of from 10 kPa to 500 kPa. The UV-curable pressure-sensitive adhesive layer has a storage modulus of elasticity at room temperature, $G'2_{RT}$, of from 100 kPa to 1,000 kPa, and a storage modulus of elasticity at 80° C., $G'2_{80}$, of from 10 kPa to 1,000 kPa. $G'1_{RT}/G'2_{RT}$ is 1 or more.

5 Claims, 1 Drawing Sheet

(56) References Cited

U.S. PATENT DOCUMENTS

| | | | |
|---|---|---|---|
| 5,187,007 A | 2/1993 | Ebe et al. | |
| 2013/0149842 A1* | 6/2013 | Senzai | H01L 24/29 |
| | | | 428/141 |
| 2016/0333225 A1* | 11/2016 | Enoki | H01L 21/6836 |
| 2018/0286736 A1* | 10/2018 | Kakiuchi | C09J 153/00 |

FOREIGN PATENT DOCUMENTS

| | | | | |
|---|---|---|---|---|
| JP | 2019161031 A | * | 9/2019 | C09J 133/04 |
| JP | 2020025016 A | * | 2/2020 | B32B 27/308 |
| WO | WO-2017061132 A1 | * | 4/2017 | B32B 27/32 |

* cited by examiner

PRESSURE-SENSITIVE ADHESIVE SHEET FOR SEMICONDUCTOR WAFER PROCESSING

This application claims priority under 35 U.S.C Section 119 to Japanese Patent Application No. 2021-102607 filed on Jun. 21, 2021 which is herein incorporated by reference.

BACKGROUND OF THE INVENTION

1. Field of the Invention

The present disclosure relates to a pressure-sensitive adhesive sheet for semiconductor wafer processing.

2. Description of the Related Art

A semiconductor wafer is used in various applications, such as a personal computer, a smartphone, and an automobile. In a processing process for the semiconductor wafer, a pressure-sensitive adhesive sheet is used to protect its surface during processing. In recent years, miniaturization and high functionalization of a large scale integrated circuit (LSI) have been advanced, and hence a surface structure of the wafer has been complicated. In processing of a semiconductor wafer having an uneven structure such as bumps, a pressure-sensitive adhesive sheet having an intermediate layer between its base material and pressure-sensitive adhesive layer is sometimes used in order to improve adhesiveness with the semiconductor wafer (unevenness-embedding property). However, the pressure-sensitive adhesive sheet having the intermediate layer sometimes makes it difficult to cut the sheet, and is sometimes reduced in adhesiveness with the semiconductor wafer over time. In addition, during storage, the intermediate layer sometimes sticks out of the pressure-sensitive adhesive sheet to reduce its handleability.

In recent years, along with downsizing and thinning of various products, thinning of the semiconductor wafer has been advanced. In the case of a wafer that has been processed to be thin, when the pressure-sensitive adhesive sheet has excessively high pressure-sensitive adhesive strength, the wafer itself is sometimes broken at the time of peeling of the pressure-sensitive adhesive sheet. In order to prevent adhesive residue on the semiconductor wafer, and the breakage of the wafer at the time of peeling, there has been proposed a pressure-sensitive adhesive sheet using a UV-curable pressure-sensitive adhesive (Japanese Patent Application Laid-open No. Heisei 6-49420 and Japanese Patent Application Laid-open No. Showa 62-153376). However, a pressure-sensitive adhesive sheet excellent in adhesiveness with the semiconductor wafer sometimes leaves adhesive residue even when using the UV-curable pressure-sensitive adhesive.

SUMMARY OF THE INVENTION

The present disclosure has been made to solve the problems of the related art, and provides a pressure-sensitive adhesive sheet for semiconductor wafer processing that is excellent in adhesiveness with a semiconductor wafer, has light peelability, and suppresses adhesive residue.

According to at least one embodiment of the present disclosure, there is provided a pressure-sensitive adhesive sheet for semiconductor wafer processing, including in this order: a base material; an intermediate layer; and a UV-curable pressure-sensitive adhesive layer, wherein the intermediate layer has a storage modulus of elasticity at room temperature, $G'1_{RT}$, of from 300 kPa to 2,000 kPa, and a storage modulus of elasticity at 80° C., $G'1_{80}$, of from 10 kPa to 500 kPa, wherein the UV-curable pressure-sensitive adhesive layer has a storage modulus of elasticity at room temperature, $G'2_{RT}$, of from 100 kPa to 1,000 kPa, and a storage modulus of elasticity at 80° C., $G'2_{80}$, of from 10 kPa to 1,000 kPa, and wherein $G'1_{RT}/G'2_{RT}$ is 1 or more.

In at least one embodiment of the present disclosure, the intermediate layer and the UV-curable pressure-sensitive adhesive layer each contain an acrylic resin.

In at least one embodiment of the present disclosure, the UV-curable pressure-sensitive adhesive layer contains a polymer having a polymerizable carbon-carbon double bond introduced into a side chain thereof.

In at least one embodiment of the present disclosure, the intermediate layer contains a photopolymerization initiator and is free of any UV-curable component.

In at least one embodiment of the present disclosure, the acrylic resin contained in the intermediate layer is a polymer obtained by one of emulsion polymerization or solution polymerization.

In at least one embodiment of the present disclosure, the pressure-sensitive adhesive sheet for semiconductor wafer processing according to at least one embodiment of the present disclosure is a backgrinding tape.

In at least one embodiment of the present disclosure, the pressure-sensitive adhesive sheet for semiconductor wafer processing according to at least one embodiment of the present disclosure is configured to be bonded to a semiconductor wafer having unevenness.

DESCRIPTION OF THE EMBODIMENTS

Figure 1:
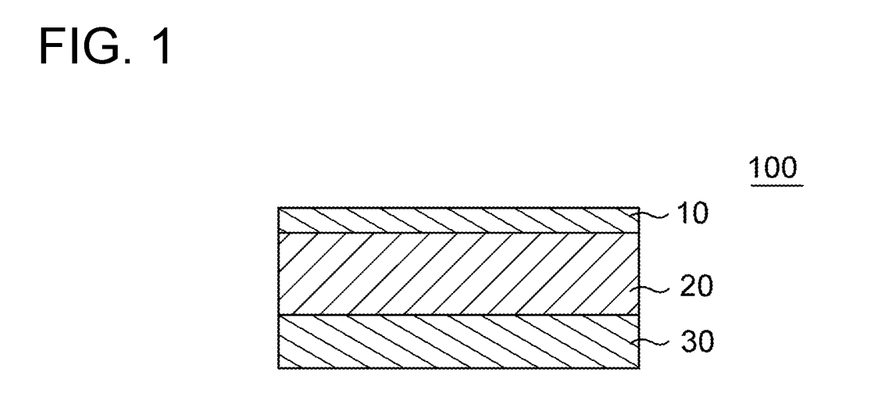
FIG. 1 is a schematic sectional view of a pressure-sensitive adhesive sheet for semiconductor wafer processing according to at least one embodiment of the present disclosure.

A. Outline of Pressure-Sensitive Adhesive Sheet for Semiconductor Wafer Processing FIG. 1 is a schematic sectional view of a pressure-sensitive adhesive sheet for semiconductor wafer processing according to at least one embodiment of the present disclosure. A pressure-sensitive adhesive sheet 100 for semiconductor wafer processing of the illustrated example includes in this order: a base material 30; an intermediate layer 20; and a UV-curable pressure-sensitive adhesive layer 10. The intermediate layer 20 has a storage modulus of elasticity at room temperature, $G'1_{RT}$, of from 300 kPa to 2,000 kPa, and a storage modulus of elasticity at 80° C., $G'1_{80}$, of from 10 kPa to 500 kPa. The UV-curable pressure-sensitive adhesive layer 10 has an initial storage modulus of elasticity, $G'2_{RT}$, of from 100 kPa to 1,000 kPa, and a storage modulus of elasticity at 80° C., $G'2_{80}$, of from 10 kPa to 1,000 kPa. In the pressure-sensitive adhesive sheet for semiconductor wafer processing according to at least one embodiment of the present disclosure, $G'1_{RT}/G'2_{RT}$ is 1 or more. Accordingly, the pressure-sensitive adhesive sheet is excellent in adhesiveness with a semiconductor wafer, has light peelability, and can suppress adhesive residue on the semiconductor wafer. Further, the pressure-sensitive adhesive sheet for semiconductor wafer processing according to at least one embodiment of the present disclosure can suppress adhesive residue on a cutter and prevent the contamination of a processing apparatus. In addition, the cutting property of the pressure-sensitive adhesive sheet for semiconductor wafer processing can also be improved. Further, a reduction in handleability due to the intermediate layer sticking out during storage can be prevented. The pressure-sensitive adhesive sheet for semiconductor wafer processing according to at least one embodiment of the present disclosure is excellent in unevenness followability, and hence can hold its adhesiveness with a semiconductor wafer even when the semiconductor wafer has unevenness on its surface. When the pressure-sensitive adhesive sheet for semiconductor wafer processing according to at least one embodiment of the present disclosure is peeled, the pressure-sensitive adhesive sheet can exhibit light peelability through curing of the pressure-sensitive adhesive layer by irradiation with UV light, and can also prevent adhesive residue on the semiconductor wafer. In at least one embodiment of the present disclosure, the pressure-sensitive adhesive sheet for semiconductor wafer processing according to the embodiment is bonded to a semiconductor wafer while being heated. Accordingly, the pressure-sensitive adhesive sheet is further improved in adhesiveness to the semiconductor wafer at the time of the bonding, and can be further improved in unevenness-embedding property when the semiconductor wafer has unevenness on its surface. In addition, under general conditions in a backgrinding tape-bonding process (e.g., a table temperature of 80° C. and a cutter temperature of 180° C.), the intermediate layer has appropriate elasticity, and adhesive residue on a cutter at the time of the cutting of the pressure-sensitive adhesive sheet can be suppressed. Further, during processing, such as a backgrinding process and a polishing process in which high temperature and high pressure are applied (e.g., a polishing process to be performed with Gettering DP (DISCO Corporation) in order to impart high flexural strength and a gettering effect), the pressure-sensitive adhesive sheet can adhere to and appropriately hold the semiconductor wafer, and hence the processing can be stably performed. Herein, the storage modulus of elasticity at room temperature refers to a storage modulus of elasticity at 23° C.

The intermediate layer 20 has a storage modulus of elasticity at room temperature, $G'1_{RT}$, of from 300 kPa to 2,000 kPa, and a storage modulus of elasticity at 80° C., $G'1_{80}$, of from 10 kPa to 500 kPa. The $G'1_{RT}$ is preferably from 400 kPa to 1,500 kPa, more preferably from 500 kPa to 1,000 kPa, still more preferably from 600 kPa to 950 kPa. The $G'1_{80}$ is preferably from 20 kPa to 300 kPa, more preferably from 40 kPa to 200 kPa, still more preferably from 50 kPa to 100 kPa. When the $G'1_{RT}$ and the $G'1_{80}$ fall within the ranges, the adhesiveness to a semiconductor wafer can be improved.

The UV-curable pressure-sensitive adhesive layer has a storage modulus of elasticity at room temperature, $G'2_{RT}$, of from 100 kPa to 1,000 kPa, and a storage modulus of elasticity at 80° C., $G'2_{80}$, of from 10 kPa to 1,000 kPa. The $G'2_{RT}$ is preferably from 120 kPa to 800 kPa, more preferably from 130 kPa to 600 kPa, still more preferably from 150 kPa to 400 kPa. The $G'2_{80}$ is preferably from 30 kPa to 800 kPa, more preferably from 50 kPa to 500 kPa, still more preferably from 70 kPa to 300 kPa.

In at least one embodiment of the present disclosure, $G'1_{RT}/G'2_{RT}$ is 1 or more. When $G'1_{RT}/G'2_{RT}$ is 1 or more, there can be provided a pressure-sensitive adhesive sheet for semiconductor wafer processing that is excellent in adhesiveness with a semiconductor wafer, and that has light peelability and suppresses adhesive residue. Further, adhesive residue on a cutter at the time of the cutting of the pressure-sensitive adhesive sheet can also be suppressed. In addition, during processing, such as a backgrinding process and a polishing process in which high temperature and high pressure are applied, the pressure-sensitive adhesive sheet can adhere to and appropriately hold the semiconductor wafer, and hence the processing can be stably performed. $G'1_{RT}/G'2_{RT}$ is preferably 1.2 or more, more preferably 1.3 or more, still more preferably 1.4 or more. $G'1_{RT}/G'2_{RT}$ is, for example, 5.0 or less.

In at least one embodiment of the present disclosure, the intermediate layer 20 contains a photopolymerization initiator and is free of any UV-curable component. Accordingly, the intermediate layer is not cured when irradiated with UV light, and hence can maintain its flexibility. In addition, a photopolymerization initiator contained in the UV-curable pressure-sensitive adhesive layer can be prevented from migrating to the intermediate layer to reduce the content of the photopolymerization initiator in the UV-curable pressure-sensitive adhesive layer over time. Accordingly, the UV-curable pressure-sensitive adhesive layer can be appropriately cured by UV irradiation to exhibit light peelability. As a result, adhesive residue on a semiconductor wafer and the breakage of a thinned wafer can be prevented.

In at least one embodiment of the present disclosure, the UV-curable pressure-sensitive adhesive layer and the intermediate layer contain equal amounts of the photopolymerization initiator. When the UV-curable pressure-sensitive adhesive layer and the intermediate layer contain equal amounts of the photopolymerization initiator, the content of the photopolymerization initiator in the UV-curable pressure-sensitive adhesive layer can be stably maintained over time to exhibit light peelability. As used herein, the term "equal amounts" means that the content (concentration) of the photopolymerization initiator in the UV-curable pressure-sensitive adhesive layer and the content (concentration) of the photopolymerization initiator in the intermediate layer are equal to each other. Specifically, the term "equal amounts" means that the content of the photopolymerization initiator in a composition for forming the pressure-sensitive adhesive layer and the content of the photopolymerization initiator in a composition for forming the intermediate layer are identical to each other.

The thickness of the pressure-sensitive adhesive sheet may be set to any appropriate range. The thickness is preferably from 10 μm to 1,000 μm, more preferably from 50 μm to 300 μm, still more preferably from 100 μm to 300 μm.

B. Base Material

The base material may be formed of any appropriate resin. Specific examples of the resin for forming the base material include polyester-based resins, such as polyethylene terephthalate (PET), polyethylene naphthalate (PEN), polybutylene terephthalate (PBT), and polybutylene naphthalate (PBN), polyolefin-based resins, such as an ethylene-vinyl acetate copolymer, an ethylene-methyl methacrylate copolymer, polyethylene, polypropylene, and an ethylene-propylene copolymer, polyvinyl alcohol, polyvinylidene chloride, polyvinyl chloride, a vinyl chloride-vinyl acetate copolymer, polyvinyl acetate, polyamide, polyimide, celluloses, a fluorine-based resin, polyether, polystyrene-based resins, such as polystyrene, polycarbonate, and polyether sulfone. Of those, polyethylene terephthalate, polyethylene naphthalate, polybutylene terephthalate, and polybutylene naphthalate are preferably used. When any such resin is used, the occurrence of the warping of a semiconductor wafer can be further prevented.

The base material may further contain another component to the extent that the effects of the present disclosure are not inhibited. Examples of the other component include an antioxidant, a UV absorber, a light stabilizer, and a heat stabilizer. With regard to the kind and usage amount of the other component, the other component may be used in any appropriate amount in accordance with purposes.

In at least one embodiment of the present disclosure, the base material preferably has an antistatic function. When the base material has an antistatic function, the occurrence of static electricity at the time of the peeling of the pressure-sensitive adhesive sheet is suppressed, and hence the destruction of a circuit and adhesion of foreign matter due to static electricity can be prevented. The base material may have an antistatic function by being formed from a resin containing an antistatic agent, or may have an antistatic function by having an antistatic layer formed by applying, to any appropriate film, a composition containing an antistatic component, such as a conductive polymer, an organic or inorganic conductive substance, and an antistatic agent. When the base material has the antistatic layer, the intermediate layer is preferably laminated on the surface on which the antistatic layer is formed.

When the base material has an antistatic function, the surface resistance value of the base material is, for example, from $1.0 \times 10^2 \Omega/\square$ to $1.0 \times 10^{13} \Omega/\square$, preferably from $1.0 \times 10^6 \Omega/\square$ to $1.0 \times 10^{12} \Omega/\square$, more preferably from $1.0 \times 10^7 \Omega/\square$ to $1.0 \times 10^{11} \Omega/\square$. When the surface resistance value falls within the ranges, the occurrence of static electricity at the time of the peeling of the pressure-sensitive adhesive sheet is suppressed, and hence the destruction of a circuit and adhesion of foreign matter due to static electricity can be prevented. When a base material having an antistatic function is used as the base material, the surface resistance value of the pressure-sensitive adhesive sheet to be obtained may be, for example, from $1.0 \times 10^6 \Omega/\square$ to $1.0 \times 10^{12} \Omega/\square$.

The thickness of the base material may be set to any appropriate value. The thickness of the base material is preferably from 10 μm to 200 μm, more preferably from 20 μm to 150 μm.

The tensile modulus of elasticity of the base material may be set to any appropriate value. The tensile modulus of elasticity of the base material is preferably from 50 MPa to 6,000 MPa, more preferably from 70 MPa to 5,000 MPa. When the tensile modulus of elasticity falls within the ranges, even in the case where a semiconductor wafer has unevenness on its surface, a pressure-sensitive adhesive sheet capable of appropriately following the unevenness can be obtained.

C. UV-Curable Pressure-Sensitive Adhesive Layer

The UV-curable pressure-sensitive adhesive layer only needs to satisfy the $G'2_{RT}$ and the $G'2_{80}$, and is formed using any appropriate composition for forming a pressure-sensitive adhesive layer (pressure-sensitive adhesive layer-forming composition). The pressure-sensitive adhesive layer-forming composition (consequently the UV-curable pressure-sensitive adhesive layer to be formed) generally contains a UV-curable pressure-sensitive adhesive and a photopolymerization initiator. When the UV-curable pressure-sensitive adhesive is incorporated, a pressure-sensitive adhesive sheet having excellent pressure-sensitive adhesive strength to a semiconductor wafer before UV irradiation and excellent peelability after UV irradiation can be provided.

C-1. UV-Curable Pressure-Sensitive Adhesive

Any appropriate pressure-sensitive adhesive may be used as the UV-curable pressure-sensitive adhesive. For example, a pressure-sensitive adhesive obtained by adding a UV-curable monomer and/or oligomer to any appropriate pressure-sensitive adhesive, such as an acrylic pressure-sensitive adhesive, a rubber-based pressure-sensitive adhesive, a silicone-based pressure-sensitive adhesive, and a polyvinyl ether-based pressure-sensitive adhesive, may be adopted, or a pressure-sensitive adhesive using, as a base polymer, a polymer having a polymerizable carbon-carbon double bond introduced into a side chain thereof and/or a terminal thereof may be adopted. Of those, a pressure-sensitive adhesive using, as a base polymer, a polymer having a polymerizable carbon-carbon double bond introduced into a side chain thereof and/or a terminal thereof is preferably used, and a pressure-sensitive adhesive using a polymer having a polymerizable carbon-carbon double bond introduced into a side chain thereof is more preferably used.

When the pressure-sensitive adhesive using a polymer having a polymerizable carbon-carbon double bond introduced into a side chain thereof and/or a terminal thereof is used, a polymer having a polymerizable carbon-carbon double bond introduced into a side chain thereof and/or a terminal thereof and having a pressure-sensitive adhesive property is used as the base polymer. Examples of such polymer include polymers each obtained by introducing a polymerizable carbon-carbon double bond into a resin, such as an acrylic resin, a vinyl alkyl ether-based resin, a silicone-based resin, a polyester-based resin, a polyamide-based resin, a urethane-based resin, and a styrene-diene block copolymer. Of those, an acrylic resin obtained by introducing a polymerizable carbon-carbon double bond into an acrylic resin is preferably used. When the acrylic resin is used, a pressure-sensitive adhesive sheet in which the storage modulus of elasticity and tensile modulus of elasticity of the UV-curable pressure-sensitive adhesive layer are easily adjusted, and which is excellent in balance between pressure-sensitive adhesive strength and peelability can be obtained. Further, contamination of a semiconductor wafer by a component derived from the pressure-sensitive adhesive can be reduced.

Any appropriate acrylic resin may be used as the acrylic resin. An example of the acrylic resin is a polymer obtained by polymerizing a monomer composition containing one kind or two or more kinds of esters of acrylic acid or methacrylic acid each having a linear or branched alkyl group.

The linear or branched alkyl group is preferably an alkyl group having 30 or less carbon atoms, more preferably an alkyl group having 1 to 20 carbon atoms, still more preferably an alkyl group having 4 to 18 carbon atoms. Specific examples of the alkyl group include a methyl group, an ethyl group, a propyl group, an isopropyl group, a n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, an octadecyl group, and a dodecyl group.

The monomer composition may contain any appropriate other monomer. Examples of the other monomer include functional group-containing monomers including carboxyl group-containing monomers, such as acrylic acid, methacrylic acid, carboxyethyl acrylate, carboxypentyl acrylate, itaconic acid, maleic acid, fumaric acid, and crotonic acid; acid anhydride monomers, such as maleic anhydride and itaconic anhydride; hydroxyl group-containing monomers, such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, (4-hydroxymethylcyclohexyl)-methyl acrylate, 2-hydroxyethyl vinyl ether, 4-hydroxybutyl vinyl ether, and diethylene glycol monovinyl ether; sulfonic acid group-containing monomers, such as styrenesulfonic acid, allylsulfonic acid, 2-(meth)acrylamido-2-methylpropanesulfonic acid, (meth)acrylamidopropanesulfonic acid, sulfopropyl (meth)acrylate, and (meth)acryloyloxynaphthalenesulfonic acid; and phosphoric acid group-containing monomers, such as 2-hydroxyethylacryloyl phosphate. The incorporation of the functional group-containing monomer can provide an acrylic resin into which a polymerizable carbon-carbon double bond is easily introduced. The content ratio of the functional group-containing monomer is preferably from 4 parts by weight to 30 parts by weight, more preferably from 6 parts by weight to 20 parts by weight with respect to 100 parts by weight of all monomer components of the monomer composition. The term "(meth)acrylic" refers to acrylic and/or methacrylic.

As the other monomer, a polyfunctional monomer may be used. When the polyfunctional monomer is used, for example, cohesive strength, heat resistance, or an adhesive property of the pressure-sensitive adhesive can be improved. In addition, the amount of a low-molecular-weight component in the UV-curable pressure-sensitive adhesive layer is reduced, and hence a pressure-sensitive adhesive sheet that hardly contaminates a semiconductor wafer can be obtained. Examples of the polyfunctional monomer include hexanediol (meth)acrylate, (poly)ethylene glycol di(meth)acrylate, (poly)propylene glycol di(meth)acrylate, neopentyl glycol di(meth)acrylate, pentaerythritol di(meth)acrylate, trimethylolpropane tri(meth)acrylate, pentaerythritol tri(meth)acrylate, dipentaerythritol hexa(meth)acrylate, epoxy (meth)acrylate, polyester (meth)acrylate, and urethane (meth)acrylate. The content ratio of the polyfunctional monomer is preferably from 1 part by weight to 100 parts by weight, more preferably from 5 parts by weight to 50 parts by weight with respect to 100 parts by weight of all monomer components of the monomer composition.

The acrylic resin has a weight-average molecular weight of preferably 300,000 or more, more preferably 500,000 or more, still more preferably from 800,000 to 3,000,000. When the weight-average molecular weight falls within such ranges, bleeding of the low-molecular-weight component can be prevented, and hence a pressure-sensitive adhesive sheet for semiconductor wafer processing having a low contamination property can be obtained. The (meth)acrylic resin has a molecular weight distribution (weight-average molecular weight/number-average molecular weight) of preferably from 1 to 20, more preferably from 3 to 10. When the (meth)acrylic resin having a narrow molecular weight distribution is used, bleeding of the low-molecular-weight component can be prevented, and hence a pressure-sensitive adhesive sheet having a low contamination property can be obtained. The weight-average molecular weight and the number-average molecular weight may be determined by gel permeation chromatography measurement (solvent: tetrahydrofuran, polystyrene equivalent).

The polymer having a polymerizable carbon-carbon double bond introduced into a side chain thereof and/or a terminal thereof may be obtained by any appropriate method. The polymer may be obtained by, for example, subjecting a resin obtained by any appropriate polymerization method and a compound having a polymerizable carbon-carbon double bond to a reaction (e.g., a condensation reaction or an addition reaction). Specifically, when the acrylic resin is used, an acrylic resin having a polymerizable carbon-carbon double bond introduced thereinto may be obtained by subjecting an acrylic resin (copolymer) having a structural unit derived from a monomer having any appropriate functional group to polymerization in any appropriate solvent, and then subjecting the resultant to a reaction between a functional group of the acrylic resin and the compound having a polymerizable carbon-carbon double bond that may react with the functional group. The amount of the compound having a polymerizable carbon-carbon double bond to be subjected to the reaction is preferably from 4 parts by weight to 30 parts by weight, more preferably from 4 parts by weight to 20 parts by weight with respect to 100 parts by weight of the above-mentioned resin. As the solvent, any appropriate solvent may be used. Examples thereof include various organic solvents, such as ethyl acetate, methyl ethyl ketone, and toluene.

When the resin and the compound having a polymerizable carbon-carbon double bond are subjected to a reaction with each other as described above, the resin and the compound having a polymerizable carbon-carbon double bond preferably have functional groups that can react with each other. The combination of the functional groups is, for example, a carboxyl group/an epoxy group, a carboxyl group/an aziridine group, or a hydroxyl group/an isocyanate group. Of those combinations of the functional groups, a combination of a hydroxyl group and an isocyanate group is preferred from the viewpoint of ease of reaction tracking.

Examples of the compound having a polymerizable carbon-carbon double bond include 2-isocyanatoethyl methacrylate, methacryloyl isocyanate, 2-methacryloyloxyethyl isocyanate (2-isocyanatoethyl methacrylate), and m-isopropenyl-α,α-dimethylbenzyl isocyanate.

When the pressure-sensitive adhesive obtained by adding the UV-curable monomer and/or oligomer is used, any appropriate monomer or oligomer may be used as each of the UV-curable monomer and oligomer. Examples of the UV-curable monomer include urethane (meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxy penta(meth)acrylate, dipentaerythritol hexa(meth)acrylate, and 1,4-butanediol di(meth)acrylate. Examples of the UV-curable oligomer include a urethane-based oligomer, a polyether-based oligomer, a polyester-based oligomer, a polycarbonate-based oligomer, and a polybutadiene-based oligomer. An oligomer having a molecular weight of from about 100 to about 30,000 is preferably used as the oligomer. The monomers and the oligomers may be used alone or in combination thereof.

The monomer and/or the oligomer may be used in any appropriate amount in accordance with the kind of the pressure-sensitive adhesive to be used. The amount of the monomer and/or oligomer to be used is, for example, preferably from 5 parts by weight to 500 parts by weight, more preferably from 40 parts by weight to 150 parts by weight with respect to 100 parts by weight of the base polymer for forming the pressure-sensitive adhesive.

C-2. Photopolymerization Initiator

Any appropriate initiator may be used as the photopolymerization initiator. Examples of the photopolymerization initiator include acyl phosphine oxide-based photoinitiators, such as ethyl 2,4,6-trimethylbenzylphenyl phosphinate and (2,4,6-trimethylbenzoyl)-phenylphosphine oxide; α-ketolbased compounds, such as 4-(2-hydroxyethoxy)phenyl(2-hydroxy-2-propyl) ketone, α-hydroxy-α,α'-dimethylacetophenone, 2-methyl-2-hydroxypropiophenone, and 1-hydroxycyclohexyl phenyl ketone; acetophenone-based compounds, such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether-based compounds, such as benzoin ethyl ether, benzoin isopropyl ether, and anisoin methyl ether; ketal-based compounds, such as benzyl dimethyl ketal; aromatic sulfonyl chloride-based compounds, such as 2-naphthalenesulfonyl chloride; photoactive oxime-based compounds, such as 1-phenone-1,1-propanedione-2-(o-ethoxycarbonyl)oxime; benzophenone-based compounds, such as benzophenone, benzoylbenzoic acid, and 3,3'-dimethyl-4-methoxybenzophenone; thioxanthone-based compounds, such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketones; and acyl phosphonates, and α-hydroxyacetophenones, such as 2-hydroxy-1-(4-(4-(2-hydroxy-2-methylpropionyl)benzyl)phenyl-2-methylpropane-1. Of those, 2,2-dimethoxy-2-phenylacetophenone and 2-hydroxy-1-(4-(4-(2-hydroxy-2-methylpropionyl)benzyl)phenyl-2-methylpropane-1 may be preferably used. Those photopolymerization initiators may be used alone or in combination thereof.

As the photopolymerization initiator, a commercially available product may also be used. Examples thereof include products available under the product names of Omnirad 127 and Omnirad 651 from IGM Resins B.V.

The photopolymerization initiator is used in any appropriate amount. The content of the photopolymerization initiator is preferably from 0.5 part by weight to 20 parts by weight, more preferably from 0.5 part by weight to 10 parts by weight with respect to 100 parts by weight of the above-mentioned UV-curable pressure-sensitive adhesive. When the content of the photopolymerization initiator is less than 0.5 part by weight, the UV-curable pressure-sensitive adhesive may not be sufficiently cured at the time of UV irradiation. When the content of the photopolymerization initiator is more than 10 parts by weight, the storage stability of the pressure-sensitive adhesive may reduce.

C-3. Additive

The pressure-sensitive adhesive layer-forming composition may contain any appropriate additive as required. Examples of the additive include a cross-linking agent, a catalyst (e.g., a platinum catalyst), a tackifier, a plasticizer, a pigment, a dye, a filler, an age resistor, a conductive material, a UV absorber, a light stabilizer, a peeling modifier, a softener, a surfactant, a flame retardant, and a solvent.

In at least one embodiment of the present disclosure, the pressure-sensitive adhesive layer-forming composition further contains a cross-linking agent. Examples of the cross-linking agent include an isocyanate-based cross-linking agent, an epoxy-based cross-linking agent, an aziridine-based cross-linking agent, and a chelate-based cross-linking agent. The content ratio of the cross-linking agent is preferably from 0.01 part by weight to 10 parts by weight, more preferably from 0.02 part by weight to 5 parts by weight, still more preferably from 0.025 part by weight to 0.5 part by weight with respect to 100 parts by weight of the base polymer contained in the UV-curable pressure-sensitive adhesive. The flexibility of the pressure-sensitive adhesive layer can be controlled by the content ratio of the cross-linking agent. When the content of the cross-linking agent is less than 0.01 part by weight, the pressure-sensitive adhesive becomes sol, and hence the pressure-sensitive adhesive layer may not be formed. When the content of the cross-linking agent is more than 10 parts by weight, adhesiveness to a semiconductor wafer may reduce, and the semiconductor wafer may not be sufficiently protected.

In at least one embodiment of the present disclosure, the isocyanate-based cross-linking agent is preferably used. The isocyanate-based cross-linking agent is preferred because the cross-linking agent can react with various kinds of functional groups. A cross-linking agent having 3 or more isocyanate groups is particularly preferably used. When the isocyanate-based cross-linking agent is used as the cross-linking agent and the content ratio of the cross-linking agent falls within the ranges, a pressure-sensitive adhesive layer excellent in peelability even after heating and leaving a remarkably reduced amount of adhesive residue can be formed.

The thickness of the UV-curable pressure-sensitive adhesive layer may be set to any appropriate value. The thickness of the pressure-sensitive adhesive layer is preferably from 1 μm to 15 μm, more preferably from 1 μm to 10 μm, still more preferably from 1 μm to 6 μm. When the thickness of the pressure-sensitive adhesive layer falls within the ranges, the layer can exhibit sufficient pressure-sensitive adhesive strength to a semiconductor wafer.

The modulus of elasticity (Young's modulus) of the pressure-sensitive adhesive layer before UV irradiation is preferably from 0.05 MPa to 2.0 MPa, more preferably from 0.075 MPa to 1.5 MPa, still more preferably from 0.3 MPa to 1.5 MPa, particularly preferably 0.4 MPa or more and less than 1.5 MPa. When the modulus of elasticity before UV irradiation falls within such ranges, a pressure-sensitive adhesive sheet having pressure-sensitive adhesive strength sufficient for holding a semiconductor wafer can be obtained. In this specification, the modulus of elasticity of the pressure-sensitive adhesive layer refers to a modulus of elasticity (Young's modulus) measured by the following method.

The pressure-sensitive adhesive layer-forming composition is applied to a separator at an application thickness of 5 μm, and is dried at 130° C. for 2 minutes. Next, only the pressure-sensitive adhesive layer after the application and drying is rolled up from its edge to produce a rod-shaped sample, and its thickness (sectional area) is measured. The resultant sample is pulled with a tensile tester (manufactured by Shimadzu Corporation, product name: "AG-IS") under the conditions of a chuck-to-chuck distance of 10 mm, a tensile rate of 50 mm/min, and room temperature, and the initial slope (Young's modulus) in this case is defined as the modulus of elasticity.

The modulus of elasticity of the pressure-sensitive adhesive layer after UV irradiation is preferably 1 MPa or more, more preferably 5 MPa or more, still more preferably 10 MPa or more. When the modulus of elasticity after UV irradiation falls within such ranges, a pressure-sensitive adhesive sheet excellent in peelability after a predetermined process (e.g., a backgrinding process) can be obtained. The modulus of elasticity of the pressure-sensitive adhesive layer after UV irradiation is, for example, 1,000 MPa or less, preferably 500 MPa or less, more preferably 400 MPa or less.

The pressure-sensitive adhesive layer may be formed of one layer, or two or more layers. When the pressure-sensitive adhesive layer is formed of two or more layers, the pressure-sensitive adhesive layer only needs to include at least one pressure-sensitive adhesive layer formed by using the pressure-sensitive adhesive layer-forming composition containing the photopolymerization initiator. When the pressure-sensitive adhesive layer is formed of two or more layers, a pressure-sensitive adhesive layer formed by using the pressure-sensitive adhesive layer-forming composition containing the photopolymerization initiator is preferably formed on a surface of the pressure-sensitive adhesive sheet to be brought into contact with a semiconductor wafer. A pressure-sensitive adhesive layer that is not formed of the pressure-sensitive adhesive layer-forming composition may be formed of any appropriate pressure-sensitive adhesive composition. The pressure-sensitive adhesive composition may be a UV-curable pressure-sensitive adhesive or a pressure-sensitive adhesive.

D. Intermediate Layer

The intermediate layer only needs to satisfy the $G'1_{RT}$ and the $G'1_{80}$, and may be formed of any appropriate material. The intermediate layer may be formed of, for example, a resin, such as an acrylic resin, a polyethylene-based resin, an ethylene-vinyl alcohol copolymer, an ethylene vinyl acetate-based resin, and an ethylene methyl methacrylate resin, or a pressure-sensitive adhesive. The intermediate layer preferably contains an acrylic resin. In at least one embodiment of the present disclosure, the UV-curable pressure-sensitive adhesive layer and the intermediate layer each contain the acrylic resin. When the UV-curable pressure-sensitive adhesive layer and the intermediate layer each contain the acrylic resin, the pressure-sensitive adhesive sheet for semiconductor wafer processing can be obtained that is excellent in adhesiveness with a semiconductor wafer, has light peelability, and suppresses adhesive residue. Further, the acrylic resin is also excellent in transparency and heat resistance. Accordingly, the pressure-sensitive adhesive layer can be irradiated with sufficient UV light in a later UV irradiation process, and besides, processing can be stably performed even in a process requiring heat resistance, such as a polishing process. In addition, when the semiconductor wafer has unevenness on its surface, a pressure-sensitive adhesive sheet for semiconductor wafer processing that is excellent in unevenness followability is obtained.

The acrylic resin to be used in the intermediate layer is obtained by polymerizing a monomer composition containing any appropriate acrylic monomer. Examples of the acrylic monomer (main monomer) include (meth)acrylic acid $C_1$-$C_{20}$ alkyl esters, such as methyl (meth)acrylate, ethyl (meth)acrylate, propyl (meth)acrylate, isopropyl (meth)acrylate, n-butyl (meth)acrylate, isobutyl (meth)acrylate, s-butyl (meth)acrylate, pentyl (meth)acrylate, isopentyl (meth)acrylate, hexyl (meth)acrylate, heptyl (meth)acrylate, 2-ethylhexyl (meth)acrylate, octyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, dodecyl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate, and eicosyl (meth)acrylate. Those acrylic monomers may be used alone or in combination thereof.

The content ratio of the main monomer is preferably from 40 wt % to 99 wt % of all monomer components, more preferably from 45 wt % to 95 wt %, still more preferably from 50 wt % to 90 wt %.

In at least one embodiment of the present disclosure, the monomer composition preferably contains an acrylic monomer having a high glass transition temperature (Tg) (high-Tg acrylic monomer). When the intermediate layer contains the acrylic monomer having a high glass transition temperature, there can be provided a pressure-sensitive adhesive sheet for semiconductor wafer processing that is excellent in adhesiveness with a semiconductor wafer, and that has light peelability and suppresses adhesive residue. Further, the pressure-sensitive adhesive sheet for semiconductor wafer processing is also excellent in cutting property, and hence can also suppress adhesive residue on a cutter and prevent the contamination of a processing apparatus. In addition, a reduction in handleability due to the intermediate layer sticking out of the pressure-sensitive adhesive sheet during storage can also be prevented. In this specification, the term "high-Tg acrylic monomer" refers to a monomer whose homopolymer has a high glass transition temperature. The glass transition temperature of the homopolymer of the high-Tg acrylic monomer is, for example, 40° C. or more, preferably 50° C. or more, more preferably 60° C. or more.

Any appropriate acrylic monomer may be used as the high-Tg acrylic monomer. Examples thereof include (meth) acrylic acid esters, such as dicyclopentanyl methacrylate (Tg: 175° C.), dicyclopentanyl acrylate (Tg: 120° C.), isobornyl methacrylate (Tg: 173° C.), isobornyl acrylate (Tg: 97° C.), methyl methacrylate (Tg: 105° C.), 1-adamantyl methacrylate (Tg: 250° C.), and 1-adamantyl acrylate (Tg: 153° C.); amide group-containing vinyl monomers, such as acryloylmorpholine (Tg: 145° C.), dimethylacrylamide (Tg: 119° C.), diethylacrylamide (Tg: 81° C.), dimethylaminopropylacrylamide (Tg: 134° C.), isopropylacrylamide (Tg: 134° C.), and hydroxyethylacrylamide (Tg: 98° C.); acid monomers, such as methacrylic acid (Tg: 228° C.) and acrylic acid (Tg: 106° C.); methacrylic acid esters, such as methyl methacrylate (Tg: 105° C.) and t-butyl methacrylate (Tg: 107° C.); and N-vinylpyrrolidone (Tg: 54° C.). Those high-Tg acrylic monomers may be used alone or in combination thereof.

The content ratio of the high-Tg acrylic monomer may be set, for example, so that the glass transition temperature of the acrylic resin determined by the Fox equation on the basis of the composition of the monomer components may be −30° C. or more. The "Fox equation" is, as shown below, a relational equation between the Tg of a copolymer and the glass transition temperatures Tgi of homopolymers obtained by homopolymerizing the respective constituent monomers of the copolymer.

$$1/Tg = \Sigma(Wi/Tgi)$$

In the Fox equation, Tg represents the glass transition temperature of the copolymer (unit: K), Wi represents the weight fraction of a monomer "i" in the copolymer (copolymerization ratio on a weight basis), and Tgi represents the glass transition temperature of the homopolymer of the monomer "i" (unit: K).

Known values may be used as the glass transition temperatures of the homopolymers to be used in the calculation of the Tg. Specifically, glass transition temperatures are mentioned in "Polymer Handbook" (3rd edition, John Wiley & Sons, Inc., 1989). Herein, when a monomer has a plurality of values mentioned in Polymer Handbook, the highest value is adopted as the glass transition temperature of the monomer. A value obtained by a measurement method described in Japanese Patent Application Laid-open No. 2007-51271 may be used as the glass transition temperature of the homopolymer of a monomer that is not described in Polymer Handbook.

The content ratio of the high-Tg acrylic monomer is preferably from 1 wt % to 50 wt % of all monomer components, more preferably from 3 wt % to 40 wt %. When the content ratio of the high-Tg acrylic monomer falls within the ranges, there is provided a pressure-sensitive adhesive sheet for semiconductor wafer processing that is excellent in adhesiveness with a semiconductor wafer, and that has light peelability and suppresses adhesive residue. The pressure-sensitive adhesive sheet for semiconductor wafer processing according to at least one embodiment of the present disclosure is also excellent in cutting property, and hence can also suppress adhesive residue on a cutter and prevent the contamination of a processing apparatus. In addition, a reduction in handleability due to the intermediate layer sticking out of the pressure-sensitive adhesive sheet during storage can also be prevented.

The monomer composition may contain, in addition to the main monomer and the high-Tg acrylic monomer, any appropriate monomer copolymerizable with the main monomer (copolymerization monomer). As the copolymerization monomer, those given as examples of the other monomer in the section C-1 are used. As the copolymerization monomer, a monomer having a polar group, such as a hydroxyl group and a carboxyl group, may be preferably used, and a monomer having a hydroxyl group is more preferably used. When the monomer having a polar group is used, cohesive strength, heat resistance, cross-linkability, and the like can be improved. The copolymerization monomers may be used alone or in combination thereof.

The content ratio of the copolymerization monomer is preferably from 0.01 wt % to 30 wt % of all monomer components, more preferably from 0.1 wt % to 20 wt %, still more preferably from 1 wt % to 10 wt %. When the content ratio of the copolymerization monomer falls within the ranges, cohesive strength, heat resistance, cross-linkability, and the like can be improved.

The acrylic resin to be used in the intermediate layer is obtained by polymerizing the monomer composition containing the above-mentioned monomer components. Any appropriate method may be used as a method for the polymerization. Examples thereof include emulsion polymerization, solution polymerization, bulk polymerization, and suspension polymerization. The acrylic resin is preferably a polymer obtained by emulsion polymerization or solution polymerization. When any such polymerization method is used, various additives can be used, and hence various acrylic resins can be prepared.

Any appropriate emulsifier may be used as an emulsifier to be used in the emulsion polymerization. Examples thereof include: anionic emulsifiers, such as alkyl sulfuric acid esters, alkylbenzene sulfonic acid salts, alkyl sulfosuccinic acid salts, polyoxyethylene alkyl sulfuric acid salts, and polyoxyethylene alkyl phosphoric acid esters; and nonionic emulsifiers, such as polyoxyethylene alkyl ethers, polyoxyethylene alkylphenyl ethers, polyoxyethylene-polyoxypropylene block polymers, sorbitan fatty acid esters, and polyoxyethylene fatty acid esters. The content ratio of water may be adjusted to any appropriate amount, and for example, may be adjusted so that the solid content concentration of an acrylic polymer after the emulsion polymerization may be from 30 wt % to 75 wt %, preferably from 35 wt % to 70 wt %. Any appropriate initiator may be used as a polymerization initiator, and for example, an azo-based initiator and a peroxide-based initiator are used. A chain transfer agent may be used in order to adjust a molecular weight.

Ethyl acetate, toluene, or the like is used as a solvent in the solution polymerization. A solution concentration is, for example, from about 20 wt % to about 80 wt %. Any appropriate initiator may be used as a polymerization initiator, and for example, an azo-based initiator and a peroxide-based initiator are used. A chain transfer agent may be used in order to adjust a molecular weight. A reaction temperature is generally from 50° C. to 80° C., and a reaction time is generally from 1 hour to 8 hours.

The weight-average molecular weight of the acrylic resin is preferably from 200,000 to 15,000,000, more preferably from 300,000 to 10,000,000. The weight-average molecular weight may be measured by GPC (solvent: THF).

The glass transition temperature of the acrylic resin is preferably from −50° C. to 30° C., more preferably from −40° C. to 20° C. When the glass transition temperature falls within such ranges, there can be obtained a pressure-sensitive adhesive sheet that is excellent in heat resistance, and hence can be suitably used in a heating process.

In at least one embodiment of the present disclosure, it is preferred that the intermediate layer contain a photopolymerization initiator and be free of any UV-curable component. That is, although the intermediate layer contains the photopolymerization initiator, the intermediate layer itself is not cured by UV irradiation. Accordingly, the intermediate layer can maintain its flexibility before and after UV irradiation. In addition, when the intermediate layer contains the photopolymerization initiator, the migration of the photopolymerization initiator contained in the UV-curable pressure-sensitive adhesive layer to the intermediate layer, which results in a reduction in content of the photopolymerization initiator in the pressure-sensitive adhesive layer over time, can be suppressed. Accordingly, after UV irradiation, the pressure-sensitive adhesive sheet can exhibit excellent light peelability. In this specification, the term "UV-curable component" refers to a component capable of cross-linking through UV irradiation to undergo curing shrinkage. Specific examples thereof include those UV-curable monomers and oligomers, and polymers each having a polymerizable carbon-carbon double bond introduced into a side chain thereof and/or a terminal thereof that are given as examples in the section C.

The photopolymerization initiator may be identical to or different from the photopolymerization initiator contained in the UV-curable pressure-sensitive adhesive layer. The intermediate layer preferably contains a photopolymerization initiator identical to that of the pressure-sensitive adhesive layer. When the intermediate layer and the pressure-sensitive adhesive layer contain photopolymerization initiators identical to each other, the migration of the photopolymerization initiator from the pressure-sensitive adhesive layer to the intermediate layer can be further suppressed. As the photopolymerization initiator, the photopolymerization initiators given as examples in the section C may each be used. The photopolymerization initiators may be used alone or in combination thereof.

The content of the photopolymerization initiator in the intermediate layer is preferably from 0.1 part by weight to 10 parts by weight, more preferably from 0.5 part by weight to 8 parts by weight with respect to 100 parts by weight of the acrylic resin in a composition for forming the intermediate layer (hereinafter sometimes referred to as "intermediate layer-forming composition") When the content of the photopolymerization initiator in the intermediate layer falls within the ranges, a pressure-sensitive adhesive sheet having excellent light peelability after UV irradiation can be obtained. In at least one embodiment of the present disclosure, the photopolymerization initiator is used in an amount equal to that of the photopolymerization initiator contained in the composition for forming the UV-curable pressure-sensitive adhesive layer.

In at least one embodiment of the present disclosure, the intermediate layer-forming composition further contains a cross-linking agent. Examples of the cross-linking agent include an isocyanate-based cross-linking agent, an epoxy-based cross-linking agent, an oxazoline-based cross-linking agent, an aziridine-based cross-linking agent, a melamine-based cross-linking agent, a peroxide-based cross-linking agent, a urea-based cross-linking agent, a metal alkoxide-based cross-linking agent, a metal chelate-based cross-linking agent, a metal salt-based cross-linking agent, a carbodiimide-based cross-linking agent, and an amine-based cross-linking agent.

When the intermediate layer-forming composition contains the cross-linking agent, the content ratio of the cross-linking agent is preferably from 0.5 part by weight to 10 parts by weight, more preferably from 1 part by weight to 8 parts by weight with respect to 100 parts by weight of the acrylic resin in the intermediate layer-forming composition.

The intermediate layer-forming composition may further contain any appropriate additive as required. Examples of the additive include an active energy ray polymerization accelerator, a radical scavenger, a tackifier, a plasticizer (such as a trimellitic acid ester-based plasticizer and a pyromellitic acid ester-based plasticizer), a pigment, a dye, a filler, an age resistor, a conductive material, an antistatic agent, a UV absorber, a light stabilizer, a peeling modifier, a softener, a surfactant, a flame retardant, and an antioxidant.

The thickness of the intermediate layer may be set to any appropriate thickness. For example, when a semiconductor wafer has unevenness on its surface, the thickness of the intermediate layer is preferably set to be larger than the height of a protruding portion of the semiconductor wafer. The thickness of the intermediate layer is preferably from 10 μm to 300 μm, more preferably from 20 μm to 200 μm, still more preferably from 30 μm to 150 μm, particularly preferably from 50 μm to 150 μm. When the thickness of the intermediate layer falls within the ranges, in the case where the semiconductor wafer has unevenness on its surface, a pressure-sensitive adhesive sheet excellent in unevenness-embedding property can be obtained.

The modulus of elasticity (Young's modulus) of the intermediate layer before UV irradiation is preferably from 0.01 MPa to 10.0 MPa, more preferably from 0.01 MPa to 5.0 MPa, still more preferably from 0.01 MPa to 3.0 MPa. When the modulus of elasticity before UV irradiation falls within such ranges, in the case where the semiconductor wafer has unevenness on its surface, a pressure-sensitive adhesive sheet excellent in unevenness-embedding property can be obtained. In addition, the semiconductor wafer-holding force of the pressure-sensitive adhesive sheet can be improved. The modulus of elasticity of the intermediate layer may be measured by the following method.

The intermediate layer-forming composition was applied to a separator at an application thickness of 5 μm, and was dried at 130° C. for 2 minutes. Next, only the pressure-sensitive adhesive layer after the application and drying is rolled up from its edge to produce a rod-shaped sample, and its thickness (sectional area) is measured. The resultant sample is pulled with a tensile tester (manufactured by Shimadzu Corporation, product name: "AG-IS") under the conditions of a chuck-to-chuck distance of 10 mm, a tensile rate of 50 mm/min, and room temperature, and the initial slope (Young's modulus) in this case is defined as the modulus of elasticity.

E. Method of Producing Pressure-Sensitive Adhesive Sheet for Semiconductor Wafer Processing The pressure-sensitive adhesive sheet for semiconductor wafer processing according to at least one embodiment of the present disclosure may be produced by any appropriate method. The pressure-sensitive adhesive sheet may be produced by, for example, forming the intermediate layer on the base material, and then forming the pressure-sensitive adhesive layer on the intermediate layer. The pressure-sensitive adhesive layer and the intermediate layer may be formed by applying the composition for forming the pressure-sensitive adhesive layer and the composition for forming the intermediate layer to the base material and the intermediate layer, respectively, or may be transferred after the formation of each layer on any appropriate separator. Various methods, such as bar coater coating, air knife coating, gravure coating, gravure reverse coating, reverse roll coating, lip coating, die coating, dip coating, offset printing, frexographic printing, and screen printing, may each be adopted as a method for the application. In addition, there may be adopted, for example, a method involving separately forming the pressure-sensitive adhesive layer on a separator, and then bonding the resultant to a laminate of the base material and the intermediate layer.

F. Applications of Pressure-Sensitive Adhesive Sheet for Semiconductor Wafer Processing The pressure-sensitive adhesive sheet for semiconductor wafer processing according to at least one embodiment of the present disclosure is suitably used in a semiconductor wafer processing process. The pressure-sensitive adhesive sheet for semiconductor wafer processing has excellent pressure-sensitive adhesive strength for a semiconductor wafer before UV irradiation, and has excellent peelability after UV irradiation. Accordingly, even in the processing of a thin wafer, the pressure-sensitive adhesive sheet can be peeled with a smaller force without breaking the wafer. In addition, the pressure-sensitive adhesive sheet includes the intermediate layer, and hence, even when the semiconductor wafer has unevenness on its surface, can satisfactorily follow the unevenness. Accordingly, the pressure-sensitive adhesive sheet can hold the semiconductor wafer during processing, and can be peeled from the semiconductor wafer after the processing without causing a problem such as adhesive residue. Further, the pressure-sensitive adhesive sheet for semiconductor wafer processing according to at least one embodiment of the present disclosure is also excellent in cutting property, and hence can also suppress adhesive residue on a cutter and prevent the contamination of a processing apparatus.

The pressure-sensitive adhesive sheet for semiconductor wafer processing according to at least one embodiment of the present disclosure is bonded to a semiconductor wafer at any appropriate bonding temperature. For example, the pressure-sensitive adhesive sheet is bonded to the semiconductor wafer under a temperature of from room temperature (e.g., 23° C.) to 100° C. In the pressure-sensitive adhesive sheet for semiconductor wafer processing according to at least one embodiment of the present disclosure, the $G'1_{RT}$ is from 300 kPa to 2,000 kPa and the $G'1_{80}$ is from 10 kPa to 500 kPa, the $G'2_{RT}$ is from 100 kPa to 1,000 kPa and the $G'2_{80}$ is from 10 kPa to 1,000 kPa, and $G'1_{RT}/G'2_{RT}$ is 1 or more. Accordingly, the pressure-sensitive adhesive sheet can sufficiently adhere to the semiconductor wafer at the time of the bonding, and can exhibit an excellent holding force on the semiconductor wafer after the bonding.

In at least one embodiment of the present disclosure, the pressure-sensitive adhesive sheet for semiconductor wafer processing according to the embodiment is bonded to a semiconductor wafer while being heated. Accordingly, at the time of the bonding, the intermediate layer has low elasticity, and when the semiconductor wafer has unevenness on its surface, the unevenness followability can be further improved to further improve the unevenness-embedding property. On the other hand, at room temperature (e.g., 23° C.), the intermediate layer has high elasticity, and hence the state of adhering to the unevenness can be held. Further, adhesive residue on a cutter at the time of the cutting of the pressure-sensitive adhesive sheet can be suppressed. Further, during processing such as a backgrinding process, the pressure-sensitive adhesive sheet can appropriately hold the semiconductor wafer to prevent the warping of the wafer.

In at least one embodiment of the present disclosure, the pressure-sensitive adhesive sheet for semiconductor wafer processing according to the embodiment is used by being bonded to a semiconductor wafer having unevenness. As described above, the pressure-sensitive adhesive sheet for semiconductor wafer processing according to at least one embodiment of the present disclosure can sufficiently adhere to the semiconductor wafer at the time of the bonding, and is excellent in unevenness-embedding property even when the semiconductor wafer has unevenness on its surface. Further, after the bonding, the pressure-sensitive adhesive sheet can hold an adhering state without floating off the unevenness. Accordingly, the semiconductor wafer can be sufficiently supported in various processes.

In at least one embodiment of the present disclosure, the pressure-sensitive adhesive sheet for semiconductor wafer processing according to the embodiment may be suitably used as a backgrinding tape. The pressure-sensitive adhesive sheet can sufficiently adhere to the semiconductor wafer before UV irradiation, and can exhibit excellent light peelability after UV irradiation. Accordingly, even when the structure of the surface of the semiconductor wafer is complex, adhesive residue on the surface of the semiconductor wafer can be prevented. Accordingly, the pressure-sensitive adhesive sheet can appropriately hold the semiconductor wafer during a backgrinding process, and can be easily peeled from the semiconductor wafer after the completion of the backgrinding process and can also prevent adhesive residue on the semiconductor wafer.

EXAMPLES

Now, the present disclosure is specifically described by way of Examples, but the present disclosure is not limited to these Examples. Testing and evaluating methods in Examples are as described below. In addition, "part(s)" and "%" are by weight unless otherwise specified.

Example 1

An intermediate layer-forming composition (solid content concentration: 23 wt %) containing 100 parts by weight of an acrylic resin 1 (polymer having a Mw of 330,000 obtained by subjecting 58.4 mol of butyl acrylate (BA), 38.6 mol of methyl methacrylate (MMA), and 3 mol of 2-hydroxyethyl acrylate (HEA) to emulsion polymerization), 0.1 part by weight of a cross-linking agent (polyisocyanate compound, product name: "CORONATE L", manufactured by Tosoh Corporation), 1 part by weight of a photopolymerization initiator (manufactured by IGM Resins B.V., product name: Omnirad 127D), 0.1 part by weight of a polymerization inhibitor (manufactured by BASF, product name: Irganox 1010), and ethyl acetate was prepared. Next, the resultant intermediate layer-forming composition was applied to the silicone-treated surface of a polyester-based separator having a thickness of 38 μm (manufactured by Mitsubishi Plastics, Inc., product name: MRF), and was then heated at 120° C. for 120 seconds to remove the solvent. Thus, an intermediate layer having a thickness of 150 μm was formed.

Next, the intermediate layer formed on the separator was bonded to the antistatic-treated (ESAS) surface of an antistatic PET film having a thickness of 50 μm.

A pressure-sensitive adhesive layer-forming composition formation (solid content concentration: 15 wt %) containing 100 parts by weight of an acrylic resin 2 (acrylic resin obtained by adding 18 mol of 2-isocyanatoethyl methacrylate (manufactured by Showa Denko K.K., product name: "Karenz MOI") to a polymer obtained by subjecting 75 mol of BA, 25 mol of MMA, and 20 mol of HEA to solution polymerization), 1 part by weight of a cross-linking agent (polyisocyanate compound, product name: "CORONATE L", manufactured by Tosoh Corporation), 1 part by weight of a photopolymerization initiator (manufactured by IGM Resins B.V., product name: Omnirad 127D), 0.1 part by weight of a polymerization inhibitor (manufactured by BASF, product name: Irganox 1010), and ethyl acetate was prepared. Next, the resultant pressure-sensitive adhesive layer-forming composition formation was applied to the silicone-treated surface of a polyester-based separator having a thickness of 75 μm, and was then heated at 120° C. for 120 seconds to remove the solvent. Thus, a pressure-sensitive adhesive layer having a thickness of 6 μm was formed.

Next, the separator was peeled from the laminate of the antistatic PET film and the intermediate layer, and the pressure-sensitive adhesive layer was transferred onto the surface of the intermediate layer from which the separator had been peeled. The resultant was stored at 50° C. for 72 hours to provide a pressure-sensitive adhesive sheet (base material (50 μm)/intermediate layer (150 μm)/UV-curable pressure-sensitive adhesive layer (6 μm)). The composition of the intermediate layer-forming composition and the composition of the pressure-sensitive adhesive layer-forming composition are shown in Table 1.

TABLE 1

| | | | | | | Example 1 | Example 2 | Example 3 | Example 4 | Example 5 | Example 6 |
|---|---|---|---|---|---|---|---|---|---|---|---|
| Intermediate layer | Polymer | | Name | | | Acrylic resin 1 | Acrylic resin 1 | Acrylic resin 1 | Acrylic resin 1 | Acrylic resin 1 | Acrylic resin 4 |
| | | Monomer ratio (molar ratio) | Monomer species | Tg (° C.) | | | | | | | |
| | | | BA | −55 | | 58.4 | ← | ← | ← | ← | 58.4 |
| | | | EA | −20 | | | | | | | |
| | | | AA | 106 | | | | | | | |
| | | | MMA | 105 (high-Tg) | | 38.6 | ← | ← | ← | ← | 38.6 |

TABLE 1-continued

| | | | | | | | | | | |
|---|---|---|---|---|---|---|---|---|---|---|
| | | | HEA | −15 | 3 | ← | ← | ← | ← | 3 |
| | | Polymerization method | | | Emulsion polymerization | ← | ← | ← | ← | Solution polymerization (ethyl acetate) |
| | Blending (with respect to 100 parts of polymer) | Cross-linking agent | CORONATE L | | 0.1 Part | ← | ← | ← | ← | ← |
| | | Photo-polymerization initiator | Omnirad 127D | | 1 Part | ← | ← | ← | ← | ← |
| | | Polymerization inhibitor | Irganox 1010 | | 0.1 Part | ← | ← | ← | ← | ← |
| UV-curable pressure-sensitive adhesive layer | Polymer | | Name | | Acrylic resin 2 | ← | ← | ← | Acrylic resin 3 | ← |
| | | Monomer ratio (molar ratio) | Monomer | Tg (° C.) | | | | | | |
| | | | BA | −55 | 75 | ← | ← | ← | | |
| | | | EA | −20 | | | | | 75 | ← |
| | | | LMA | −65 | | | | | | |
| | | | MMA | 105 | 25 | ← | ← | ← | | |
| | | | ACMO | 145 | | | | | 25 | ← |
| | | | HEA | −15 | 20 | ← | ← | ← | 22 | ← |
| | | | HEMA | | | | | | | |
| | | | Karenz MOI (having double bond introduced thereinto) | — | 18 | ← | ← | ← | 18 | ← |
| | Blending (with respect to 100 parts of polymer) | Cross-linking agent | CORONATE L | | 1 | ← | 4 | 4 | 5 | ← |
| | | Photo-polymerization initiator | Omnirad 127D | | 1 | ← | 1 | 1 | 1 | ← |
| | | Polymerization inhibitor | Irganox 1010 | | 0.1 | ← | 0.1 | 0.1 | 0.1 | ← |

| | | | | | | Comparative Example 1 | Comparative Example 2 | Comparative Example 3 | Comparative Example 4 |
|---|---|---|---|---|---|---|---|---|---|
| Intermediate layer | Polymer | | Name | | | Acrylic resin 5 | ← | Acrylic resin 7 | ← |
| | | Monomer ratio (molar ratio) | Monomer species | Tg (° C.) | | | | | |
| | | | BA | −55 | | 75 | ← | 50 | ← |
| | | | EA | −20 | | | | 50 | ← |
| | | | AA | 106 | | | | 3 | ← |
| | | | MMA | 105 (high-Tg) | | 25 | ← | | |
| | | | HEA | −15 | | 5 | ← | | |
| | | Polymerization method | | | | Solution polymerization (ethyl acetate) | ← | | |
| | Blending (with respect to 100 parts of polymer) | Cross-linking agent | CORONATE L | | | | ← | 1 | ← |
| | | Photo-polymerization initiator | Omnirad 127D | | | | ← | 3 | ← |
| | | Polymerization inhibitor | Irganox 1010 | | | | ← | | |
| UV-curable pressure-sensitive adhesive layer | Polymer | | Name | | | Acrylic resin 3 | Acrylic resin 6 | Acrylic resin 3 | Acrylic resin 8 |
| | | Monomer ratio (molar ratio) | Monomer | Tg (° C.) | | | | | |
| | | | BA | −55 | | | | | |
| | | | EA | −20 | | 75 | | 75 | 75 |
| | | | LMA | −65 | | | | | |
| | | | MMA | 105 | | | | | |
| | | | ACMO | 145 | | 25 | | 25 | 25 |
| | | | HEA | −15 | | 22 | | 22 | 22 |
| | | | HEMA | | | | | | |
| | | | Karenz MOI (having double bond introduced thereinto) | — | | 18 | | 18 | 11 |

TABLE 1-continued

| | | | | | | |
|---|---|---|---|---|---|---|
| Blending (with respect to 100 parts of polymer) | Cross-linking agent | CORONATE L | 5 | 1 | 5 | 5 |
| | Photo-polymerization initiator | Omnirad 127D | 1 | 1 | 1 | 1 |
| | Polymerization inhibitor | Irganox 1010 | 0.1 | 0.1 | 0.1 | 0.1 |

Example 2

A pressure-sensitive adhesive sheet was obtained in the same manner as in Example 1 except that the thickness of the intermediate layer was changed to 100 μm.

Example 3

A pressure-sensitive adhesive sheet was obtained in the same manner as in Example 1 except that in the pressure-sensitive adhesive layer-forming composition, 4 parts by weight of the cross-linking agent was used, and the thickness of the UV-curable pressure-sensitive adhesive layer was changed to 10 μm.

Example 4

A pressure-sensitive adhesive sheet was obtained in the same manner as in Example 3 except that the thickness of the intermediate layer was changed to 100 μm.

Example 5

A pressure-sensitive adhesive sheet was obtained in the same manner as in Example 1 except that in the pressure-sensitive adhesive layer-forming composition, 100 parts by weight of an acrylic resin 3 (acrylic resin obtained by adding 18 mol of 2-isocyanatoethyl methacrylate (manufactured by Showa Denko K.K., product name: "Karenz MOI") to a polymer obtained by subjecting 75 mol of ethyl acrylate (EA), 25 mol of acryloylmorpholine (ACMO), and 22 mol of HEA to solution polymerization) was used in place of the acrylic resin 2, and 5 parts by weight of the cross-linking agent was used.

Example 6

A pressure-sensitive adhesive sheet was obtained in the same manner as in Example 5 except that, in the intermediate layer-forming composition, an acrylic resin 4 (polymer obtained by subjecting 58.4 mol of BA, 38.6 mol of MMA, and 3 mol of HEA to solution polymerization in ethyl acetate) was used in place of the acrylic resin 1.

Comparative Example 1

A pressure-sensitive adhesive sheet was obtained in the same manner as in Example 6 except that, in the intermediate layer-forming composition, 100 parts by weight of an acrylic resin 5 (polymer obtained by subjecting 75 mol of BA, 25 mol of MMA, and 5 mol of HEA to solution polymerization in ethyl acetate) was used in place of the acrylic resin 1.

Comparative Example 2

A pressure-sensitive adhesive sheet was obtained in the same manner as in Comparative Example 1 except that, in the pressure-sensitive adhesive layer-forming composition, 100 parts by weight of an acrylic resin 6 (resin obtained by polymerizing 100 mol of 2-ethylhexyl acrylate (2HEA), 20 mol of HEA, and 16 mol of 2-isocyanatoethyl methacrylate (manufactured by Showa Denko K.K., product name: "Karenz MOI")) was used in place of the acrylic resin 2, and 1 part by weight of the cross-linking agent was used.

Comparative Example 3

A pressure-sensitive adhesive sheet was obtained in the same manner as in Comparative Example 1 except that in the intermediate layer-forming composition, 100 parts by weight of an acrylic resin 7 (polymer obtained by subjecting 50 mol of BA, 50 mol of EA, and 3 mol of acrylic acid (AA) to solution polymerization in toluene) was used in place of the acrylic resin 1; the content of the cross-linking agent and the content of the photopolymerization initiator were changed to 1 part by weight and 3 parts by weight, respectively, and in the pressure-sensitive adhesive layer-forming composition, the content of the cross-linking agent was changed to 1.5 parts by weight.

Comparative Example 4

A pressure-sensitive adhesive sheet was obtained in the same manner as in Comparative Example 1 except that in the intermediate layer-forming composition, the acrylic resin 7 was used in place of the acrylic resin 5; and in the pressure-sensitive adhesive layer-forming composition, 100 parts by weight of an acrylic resin 8 (acrylic resin obtained by adding 11 mol of 2-isocyanatoethyl methacrylate (manufactured by Showa Denko K.K., product name: "Karenz MOI") to a polymer obtained by subjecting 75 mol of ethyl acrylate (EA), 25 mol of acryloylmorpholine (ACMO), and 22 mol of HEA to solution polymerization in toluene) was used in place of the acrylic resin 2.

The following evaluations were performed by using the pressure-sensitive adhesive sheets obtained in Examples and Comparative Examples. The results are shown in Table 2.

(1) Initial Embedding Property

The pressure-sensitive adhesive sheet (230 cm×400 cm) obtained in each of Examples and Comparative Examples was bonded to a wafer (8 inch, bump height: 75 μm, diameter: 90 μm, pitch: 200 μm) through use of a tape-bonding apparatus (manufactured by Nitto Seiki Co., Ltd., product name: DR-3000III). The bonding was performed under the following conditions.

Roller pressure: 0.40 MPa
Roller speed: 5 mm/sec
Table temperature: 80° C.

After the bonding, the bonding state of the pressure-sensitive adhesive sheet and the wafer was observed with a laser microscope (magnification: 100 times). In addition, the pressure-sensitive adhesive sheet and the wafer were imaged from the pressure-sensitive adhesive sheet side under a state in which the pressure-sensitive adhesive sheet faced upward, and the image was binarized (8-bit grayscale, brightness: 0 to 255, threshold: 114) through use of image analysis software (Image J (free software)). Five bumps were randomly selected, and the number of dots used for the display of one bump was counted. An image of only a bump in a state of having no tape bonded thereto has 220 dots. When a tape is present, a number of dots closer to 220 indicates a more satisfactory embedding property. An evaluation was performed by marking a case in which the average number of dots for the five bumps was 830 or less with a circle symbol, and marking a case in which the average number of dots was more than 830 with an "x" symbol.

(2) Embedding Property Over Time

The laminate of the pressure-sensitive adhesive sheet and the wafer subjected to the initial embedding property evaluation was left to stand at room temperature for 1 week. After that, in the same manner as in the initial embedding property evaluation, the pressure-sensitive adhesive sheet and the wafer were imaged, and the image was binarized. The resultant average number of dots was compared to the average number of dots in the initial embedding property evaluation to determine the amount of change in average number of dots ((average number of dots in initial embedding property evaluation)−(average number of dots in evaluation of embedding property over time)). An evaluation was performed by marking a case in which the amount of change in average number of dots was 15 or less with the circle symbol, and marking a case in which the amount of change in average number of dots was more than 15 with the "x" symbol.

(3) Adhesive Residue

Figure 2:
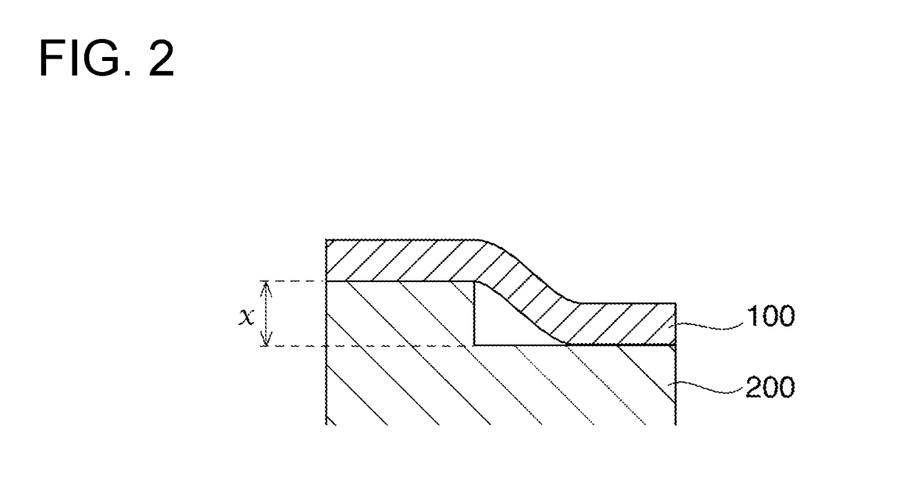
FIG. 2 is a schematic sectional view for illustrating a state in which the pressure-sensitive adhesive sheet for semiconductor wafer processing is bonded to an adherend having a step.

FIG. 2 is a schematic sectional view for illustrating a state in which a pressure-sensitive adhesive sheet for semiconductor wafer processing is bonded to an adherend having a step. A silicon mirror wafer was ground to 500 μm, and a pressure-sensitive adhesive tape having a thickness of 75 μm was bonded to the ground surface of the silicon mirror wafer to produce an adherend 200 having a step illustrated in FIG. 2. A height "x" of the step of the adherend was 75 μm. A pressure-sensitive adhesive sheet (pressure-sensitive adhesive sheet for semiconductor wafer processing) 100 obtained in each of Examples and Comparative Examples was laminated on the adherend 200 having a step so as to be orthogonal to the pressure-sensitive adhesive tape, and was bonded thereto at a temperature shown in Table 2 through use of a 2 kg roller. Next, the resultant was stored in a thermostat at 60° C. for 4 days. After that, having been removed from the thermostat, the pressure-sensitive adhesive sheet for semiconductor wafer processing was irradiated with UV light (1,000 mJ/cm$^2$). Next, the pressure-sensitive adhesive sheet was peeled in a 1800 peel test (normal temperature, peel rate: 300 mm/min). After the peeling, the surface of the silicon wafer was observed with a laser microscope (magnification: 100 times), and an evaluation was performed by marking a case in which adhesive residue was not found with the circle symbol, and marking a case in which adhesive residue was found with the "x" symbol.

(4) Cutting Property of Pressure-Sensitive Adhesive Sheet

Through use of a tape-bonding apparatus (manufactured by Nitto Seiki Co., Ltd., product name: DR-3000III), the pressure-sensitive adhesive sheet obtained in each of Examples or Comparative Examples was bonded to 25 silicon mirror wafers under the following conditions. An unused cutter blade was used for the bonding. The bonding was performed at a temperature shown in Table 2.

Roll speed: 100 mm/min
Roll pressure: 0.4 MPa
Cutter speed: 300 mm/min
Cutter temperature: 180° C.
Blade angle: 1°
Cutting angle: 5°

Next, the 1st silicon mirror wafer and the 25th silicon mirror wafer were each observed with a microscope from a side surface thereof. The presence or absence of stringiness (presence or absence of contact of the intermediate layer with the side surface of the wafer) was determined, and an evaluation was performed by marking a case in which there was no stringiness with the circle symbol, and marking a case in which stringiness was observed with the "x" symbol.

(5) Stickiness of Side Surface

The pressure-sensitive adhesive sheet (2 cm wide) obtained in each of Examples and Comparative Examples was wound around a 3-inch core until a thickness of 0.5 cm was reached, to thereby provide a wound body of the pressure-sensitive adhesive sheet having a roll shape. A side surface of the resultant wound body was pressed against an acrylic plate (thickness: 5 mm) by hand. Next, the wound body was lifted by hand, and an evaluation was performed by marking a case in which the acrylic plate did not lift together with the wound body with the circle symbol, and marking a case in which the acrylic plate lifted together with the wound body with the "x" symbol.

TABLE 2

| Configuration | | | | Example 1 | Example 2 | Example 3 | Example 4 | Example 5 | Example 6 |
|---|---|---|---|---|---|---|---|---|---|
| Configuration | Configuration | Base material | Thickness [μm] | 50 | 50 | 50 | 50 | 50 | 50 |
| | | Intermediate layer | Thickness [μm] | 150 | 100 | 150 | 100 | 150 | 150 |
| | | UV-curable pressure-sensitive adhesive layer | Thickness [μm] | 6 | 6 | 10 | 10 | 6 | 6 |
| Physical properties | | Bonding temperature | | 80° C. | 80° C. | 80° C. | 80° C. | 80° C. | 80° C. |
| | Storage modulus of elasticity | G'1 | RT (23° C.) | 614,903 | 614,903 | 614,903 | 614,903 | 614,903 | 916,535 |
| | | | 80° C. | 69,435 | 69,435 | 69,435 | 69,435 | 69,435 | 74,605 |
| | | G'2 | RT (23° C.) | 177,617 | 177,617 | 350,643 | 350,643 | 340,632 | 340,632 |
| | | | 80° C. | 95,273 | 95,273 | 216,682 | 216,682 | 181,720 | 181,720 |
| | G'1/G'2 | | RT | 3 | 3.5 | 1.8 | 1.8 | 1.8 | 2.7 |
| Evaluation | Initial embedding | | Evaluation | ○ | ○ | ○ | ○ | ○ | ○ |
| | | | Average number of dots | 540 | 521 | 820 | 800 | 726 | 830 |

TABLE 2-continued

| | | | | | | | | | |
|---|---|---|---|---|---|---|---|---|---|
| Floating over time (evaluation value after 1 week) | | Evaluation | | ○ | ○ | ○ | ○ | ○ | ○ |
| | | Average number of dots | | 552 | 535 | 834 | 813 | 738 | 845 |
| Amount of change in average number of dots | | | | 12 | 14 | 14 | 13 | 12 | 15 |
| Adhesive residue | | | | ○ | ○ | ○ | ○ | ○ | ○ |
| Cutting property | | | | ○ | ○ | ○ | ○ | ○ | ○ |
| Stickiness of side surface | | | | ○ | ○ | ○ | ○ | ○ | ○ |

| | | | | Comparative Example 1 | Comparative Example 2 | Comparative Example 3 | Comparative Example 4 |
|---|---|---|---|---|---|---|---|
| Configuration | Configuration | Base material | Thickness [μm] | 50 | 50 | 50 | 50 |
| | | Intermediate layer | Thickness [μm] | 150 | 150 | 150 | 150 |
| | | UV-curable pressure-sensitive adhesive layer | Thickness [μm] | 6 | 6 | 6 | 6 |
| Physical properties | Bonding temperature | | | 80° C. | 80° C. | RT | RT |
| | Storage modulus of elasticity | G'1 | RT (23° C.) | 106,473 | 614,903 | 145,124 | 145,124 |
| | | | 80° C. | 25,431 | 69,435 | 23,086 | 23,086 |
| | | G'2 | RT (23° C.) | 340,632 | 55,287 | 112,723 | 340,632 |
| | | | 80° C. | 181,720 | 51,627 | 44,672 | 181,720 |
| | G'1/G'2 | | RT | 0.3 | 11.1 | 1.3 | 0.4 |
| Evaluation | Initial embedding | | Evaluation | ○ | ○ | ○ | ○ |
| | | | Average number of dots | 828 | 530 | 544 | 820 |
| | Floating over time (evaluation value after 1 week) | | Evaluation | x | ○ | ○ | x |
| | | | Average number of dots | 846 | 543 | 559 | 840 |
| | Amount of change in average number of dots | | | 18 | 13 | 15 | 20 |
| | Adhesive residue | | | ○ | x | x | ○ |
| | Cutting property | | | x | ○ | x | x |
| | Stickiness of side surface | | | x | ○ | x | x |

The pressure-sensitive adhesive sheet for semiconductor wafer processing according to at least one embodiment of the present disclosure may be suitably used in a semiconductor wafer processing process.

According to at least one embodiment of the present disclosure, the pressure-sensitive adhesive sheet for semiconductor wafer processing that is excellent in adhesiveness with a semiconductor wafer, and that has light peelability and suppresses adhesive residue can be provided. The pressure-sensitive adhesive sheet for semiconductor wafer processing according to at least one embodiment of the present disclosure is excellent in unevenness-embedding property, and hence can hold a sufficiently adhering state even when the semiconductor wafer has unevenness on its surface. The pressure-sensitive adhesive sheet for semiconductor wafer processing according to at least one embodiment of the present disclosure is excellent in cutting property, and hence can suppress adhesive residue on a cutter and can also prevent the contamination of a processing apparatus. In addition, a reduction in handleability due to the intermediate layer sticking out of the pressure-sensitive adhesive sheet during storage can also be prevented.

What is claimed is:

1. A pressure-sensitive adhesive sheet for semiconductor wafer processing, comprising in this order:
a base material composed of a resin;
an intermediate layer including a polymer obtained by polymerizing a monomer composition containing (meth)acrylic acid C1-C20 alkyl esters and an acrylic monomer having a glass transition temperature of 40° C. or more; and
a UV-curable pressure-sensitive adhesive layer including a polymer having a polymerizable carbon-carbon double bond introduced into a side chain thereof,
wherein the intermediate layer has a storage modulus of elasticity at room temperature, $G'1_{RT}$, of from 300 kPa to 2,000 kPa, and a storage modulus of elasticity at 80° C., $G'1_{80}$, of from 10 kPa to 500 kPa,
wherein the UV-curable pressure-sensitive adhesive layer has a storage modulus of elasticity at room temperature, $G'2_{RT}$, of from 100 kPa to 1,000 kPa, and a storage modulus of elasticity at 80° C., $G'2_{80}$, of from 10 kPa to 1,000 kPa,
wherein $G'1_{RT}/G'2_{RT}$ is 1 or more, and
wherein the intermediate layer contains a photopolymerization initiator and is free of any UV-curable component.

2. The pressure-sensitive adhesive sheet for semiconductor wafer processing according to claim 1, wherein the intermediate layer and the UV-curable pressure-sensitive adhesive layer each contain an acrylic resin.

3. The pressure-sensitive adhesive sheet for semiconductor wafer processing according to claim 2, wherein the acrylic resin contained in the intermediate layer is a polymer obtained by one of emulsion polymerization or solution polymerization.

4. The pressure-sensitive adhesive sheet for semiconductor wafer processing according to claim 1, wherein the pressure-sensitive adhesive sheet for semiconductor wafer processing is a backgrinding tape.

5. The pressure-sensitive adhesive sheet for semiconductor wafer processing according to claim 1, wherein the pressure-sensitive adhesive sheet for semiconductor wafer processing is configured to be bonded to a semiconductor wafer having unevenness.

* * * * *